United States Patent
Kim

(10) Patent No.: US 9,146,413 B2
(45) Date of Patent: Sep. 29, 2015

(54) TOUCH WINDOW

(71) Applicant: LG INNOTEK CO., LTD., Seoul (KR)

(72) Inventor: Soo Keun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 80 days.

(21) Appl. No.: 13/955,856

(22) Filed: Jul. 31, 2013

(65) Prior Publication Data

US 2014/0085547 A1 Mar. 27, 2014

(30) Foreign Application Priority Data

Sep. 26, 2012 (KR) .................. 10-2012-0107051

(51) Int. Cl.
- *G02F 1/1333* (2006.01)
- *H01L 27/32* (2006.01)
- *G06F 3/041* (2006.01)

(52) U.S. Cl.
CPC ............ *G02F 1/13338* (2013.01); *G06F 3/041* (2013.01); *H01L 27/323* (2013.01)

(58) Field of Classification Search
CPC ..... G06F 3/033; G06F 3/0426; G06F 3/0428; G06F 3/0421; G06F 3/044; G06F 3/041; G02F 1/13338; H01L 27/323
See application file for complete search history.

(56) References Cited

U.S. PATENT DOCUMENTS

| | | | |
|---|---|---|---|
| 8,026,472 B2 * | 9/2011 | Arnold ..................... | 250/221 |
| 8,179,383 B2 * | 5/2012 | Chang et al. ................ | 345/175 |
| 2010/0321309 A1 * | 12/2010 | Lee et al. .................... | 345/173 |
| 2011/0308159 A1 * | 12/2011 | Lee et al. .................... | 49/25 |
| 2012/0092647 A1 * | 4/2012 | Lim et al. .................... | 356/51 |
| 2012/0105377 A1 * | 5/2012 | Takeno et al. ............... | 345/175 |

* cited by examiner

*Primary Examiner* — Andrew Sasinowksi
(74) *Attorney, Agent, or Firm* — Saliwanchik, Lloyd & Eisenschenk

(57) ABSTRACT

Disclosed is a touch window. The touch window includes a cover window where a view area and a dead area surrounding the view area are defined; an electrode in the view area, the electrode sensing a touch position; an electrode substrate on which the electrode is formed; a sensor part in the dead area, the sensor part including a light receiving part and a light emitting part; and a scattered-reflection control part between the cover window and the sensor part.

12 Claims, 7 Drawing Sheets

TOUCH WINDOW

CROSS-REFERENCE TO RELATED APPLICATION

This application claims the benefit under 35 U.S.C. §119 of Korean Patent Application No. 10-2012-0107051, filed Sep. 26, 2012, which is hereby incorporated by reference in its entirety.

BACKGROUND

The embodiment relates to a scheme for effectively utilizing a sensor part mounted on a touch window.

As electronic appliance industry has been developed, various display devices have been developed and an image apparatus, a computer and a mobile communication terminal employing the display devices have been developed. These display devices are equipped with a function of an input device as well as a display function for displaying an image. To this end, a touch window is installed on a display surface of a display device and the display surface is pressed through the touch window such that a predetermined function corresponding to the pressed position may be performed.

The touch window includes a cover window which receives a touch input from an outside, a TSP (Touch Screen Panel) which is disposed below the cover window and in which a V/A (View Area) and a D/A (Dead Area) are implemented through a sensing electrode pattern, and a button part which is electrically connected to the TSP and is formed on the surface of the cover window as an icon.

Various sensors for sensing various external states are installed in the D/A of the touch window, and thus, a gap is generated between the sensor part in which the sensors are installed and the cover window. However, when the gap exists, signals output from the sensors are scatter-reflected and input again to the sensors, so that malfunctions may be caused in the sensors.

FIGS. 1 and 2 are views showing one example of forming a touch screen panel (TSP) according to the related art.

Referring to FIG. 1, the TSP extends below a sensor part in the related art. In this case, since the TSP is not formed between the sensor part and the cover window, a gap is formed.

Referring to FIG. 2, when the gap is formed between the sensor part and the cover window, a part of a signal emitted from a light emitting part in a sensor is scatter-reflected through the gap, so that the signal is again input to a light receiving part. The scatter-reflected signal causes a malfunction of the sensor so that the operation failure may occur.

BRIEF SUMMARY

The embodiment provides a touch window which includes a scattered-refection control part formed between a cover window and a sensor part in a dead area, so that a gap may be reduced between the cover window and the sensor part.

The embodiment provides a touch window including a cover window where a view area and a dead area surrounding the view area are defined; an electrode in the view area, the electrode sensing a touch position; an electrode substrate on which the electrode is formed; a sensor part in the dead area, the sensor part including a light receiving part and a light emitting part; and a scattered-reflection control part between the cover window and the sensor part.

According to the embodiment, the scattered-reflection control part is formed between the cover window and the sensor part in the dead area such that the scattered-reflection control part may cover the portions of the light emitting part and the light receiving part. Thus, the scattered-reflection control part blocks a signal emitted from the light emitting part to be prevented from being input to the light receiving part, so that malfunctions of the sensor part may be reduced.

DETAILED DESCRIPTION

Figure 1:
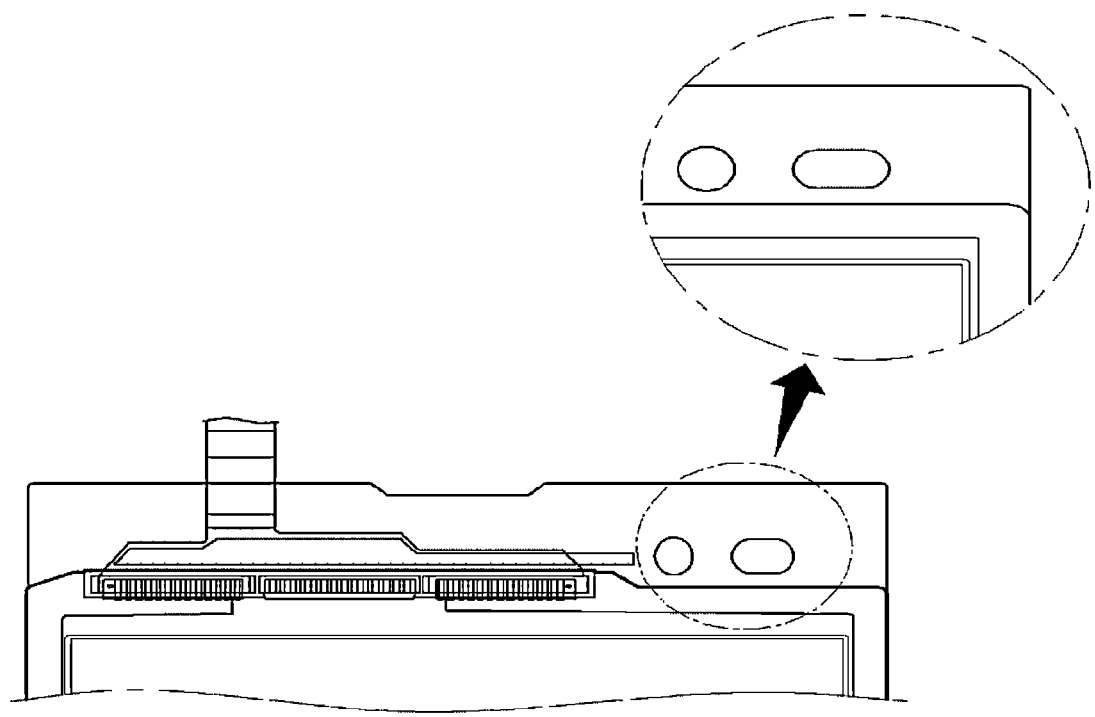
FIGS. 1 and 2 are sectional views showing one example of a touch screen panel according to the related art.
Figure 2:
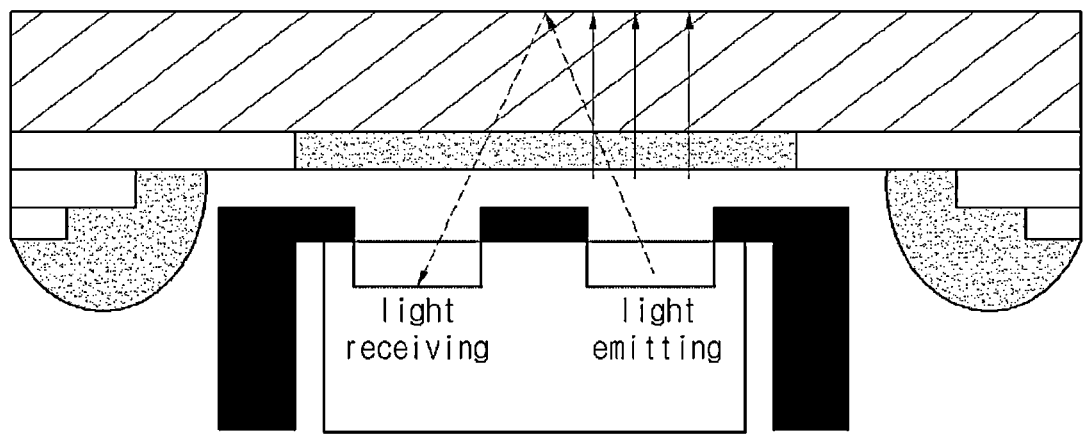

Hereinafter, the structure and the operation according to the embodiment will be described in detail with reference to accompanying drawings. In the following description based on the accompanying drawings, the same elements will be assigned with the same reference numerals regardless of drawing numbers, and the repetition in the description of the same elements having the same reference numerals will be omitted in order to avoid redundancy. Although the terms "first" and "second" may be used in the description of various elements, the embodiment is not limited thereto. The terms "first" and "second" are used to distinguish one element from the other elements.

Figure 3:
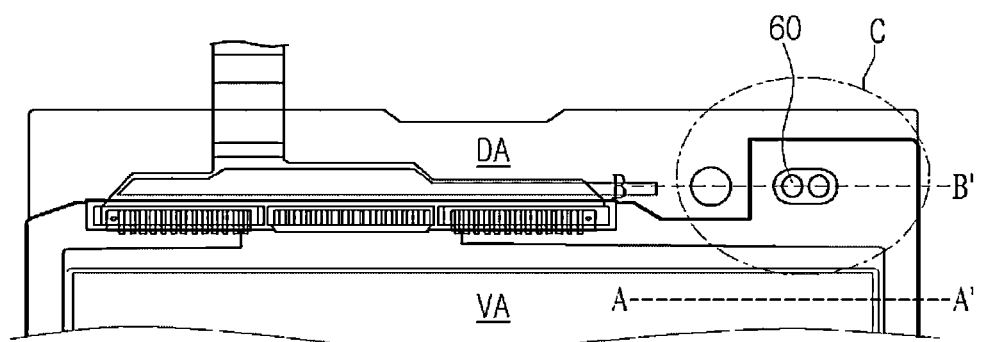
FIG. 3 is a plan view showing a touch window according to an embodiment.
Figure 4:
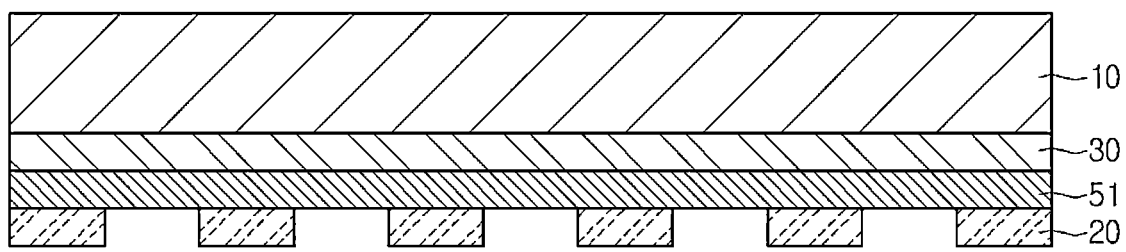
FIG. 4 is a sectional view taken along line A-A' in FIG. 3.
Figure 5:
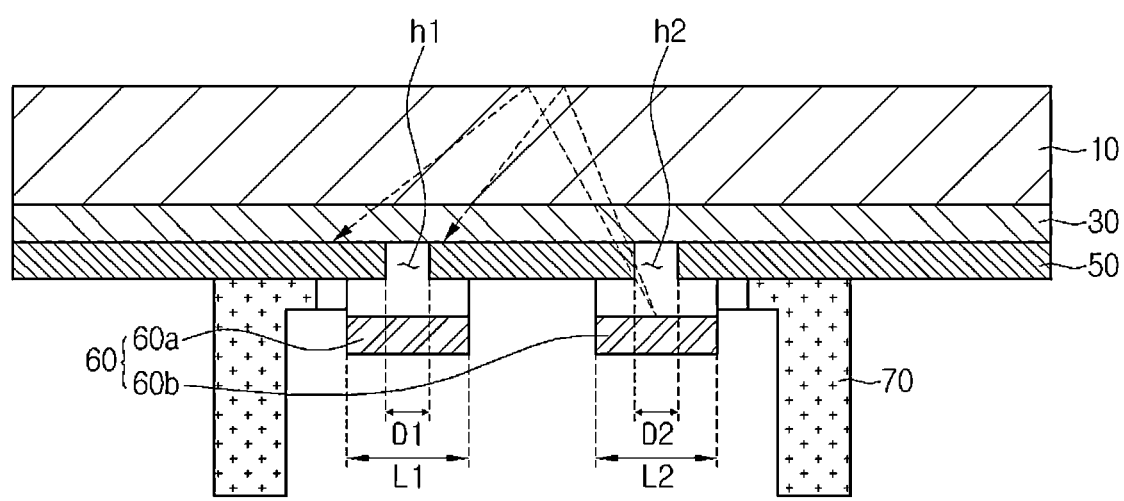
FIG. 5 is a sectional view taken along line B-B' in FIG. 3.
Figure 6:
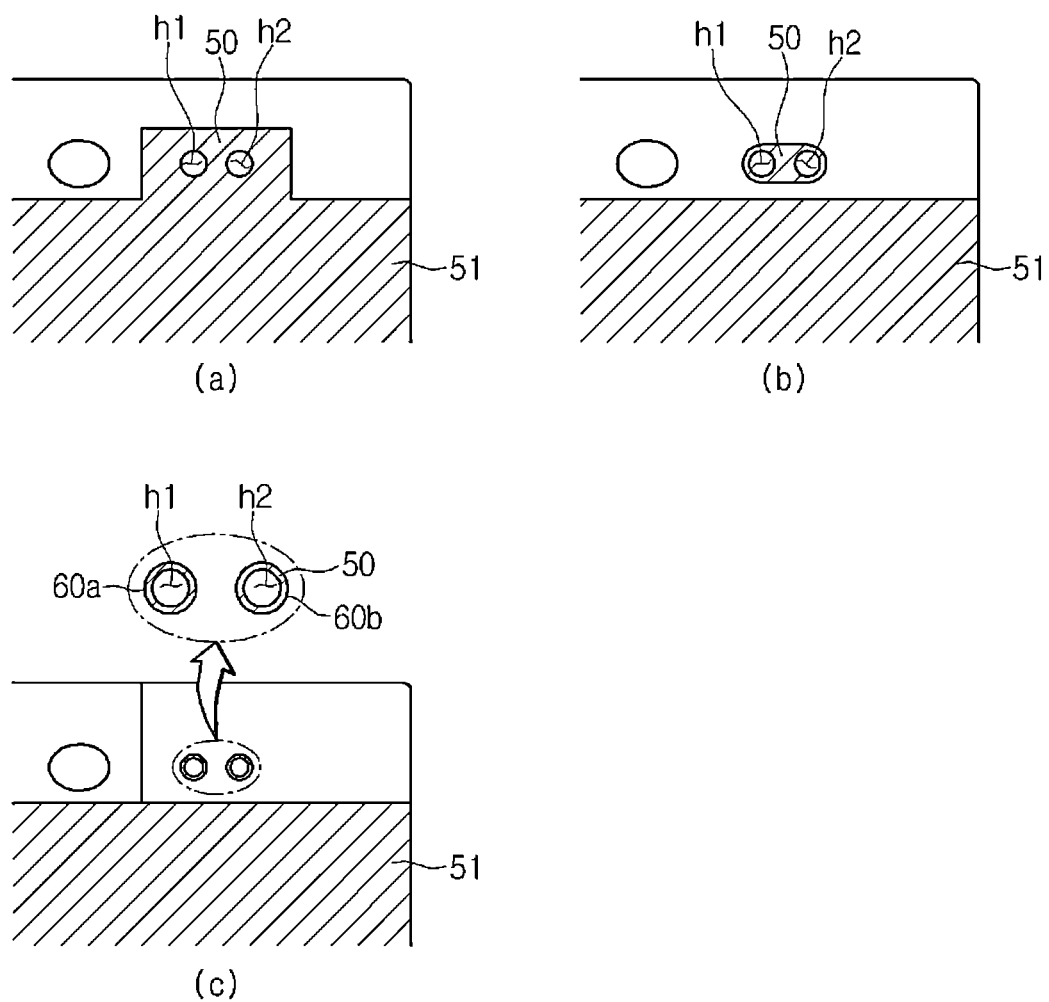
FIG. 6 is an enlarged plan view of a portion C in FIG. 3.

Hereinafter, a touch window according to an embodiment will be described in detail with reference to FIGS. 3 to 11. FIG. 3 is a plan view showing a touch window according to an embodiment. FIG. 4 is a sectional view taken along line A-A' in FIG. 3. FIG. 5 is a sectional view taken along line B-B' in FIG. 3. FIG. 6 is an enlarged plan view of a portion C in FIG. 3. FIGS. 7 to 11 are sectional views showing a touch window according to another embodiment.

Referring to FIGS. 3 to 8, a touch window includes a cover window 10 in which a VA (View Area) and a DA (Dead Area) surrounding the VA are defined.

Referring to FIGS. 3 and 4, an electrode 20, which can sense a touch position, may be disposed in the VA. The electrode 20 is disposed on an electrode substrate 51. The electrode substrate 51 may be formed of one of PET (polyethyleneterephthalate), PC (polycarbonate), PES (polyether sulfone), PI (polyimide) and PMMA (PolyMethly MethaAcrylate).

An adhesive layer 30 may be disposed between the cover window 10 and the electrode substrate 51. The adhesive layer 30 may include various materials which may be used to allow the cover window 10 and the electrode substrate 51 to adhere to each other. As one example, the adhesive layer 30 may be formed of one of PSA (Pressure Sensitive Adhesive), DPSA (Detackified PSAdhesives) and WAA (Water Activated Adhesives).

Referring to FIGS. 3 and 5, the sensor part 60 for sensing an external state may be disposed in the DA. The sensor part 60 may include a light receiving part 60a and a light emitting part 60b. The sensor part 60 may sense an external state. For example, the sensor part 60 may include a proximity sensor. A rubber 70 for supporting the sensor part 60 may be formed on a side surface of the sensor part 60.

A scattered-reflection control part 50 is disposed between the cover window 10 and the sensor part 60.

The scattered-reflection control part 50 includes a first through hole h1 and a second through hole h2. The first through hole h1 is disposed at a position corresponding to the light receiving part 60a. The second through hole h2 is disposed at a position corresponding to the light receiving part 60b. A diameter D1 of the first through hole h1 is less than a length L1 of a section of the light receiving part 60a. Similarly, a diameter D2 of the second through hole h2 is less than a length L2 of a section of the light emitting part 60b. Thus, the scattered-reflection control part 50 may cover portions of the light receiving part 60a and the light emitting part 60b.

In this case, the scattered-reflection control part 50 may prevent a fault operation which may be caused by inputting, into the light receiving part 60a, a part of a signal output from the light emitting part 60b which is scatter-reflected due to a gap between the cover window 10 and the sensor part 60.

The scattered-reflection control part 50 may extend from the electrode substrate 51. That is, referring to (a) of FIG. 6, the electrode substrate 51, on which the electrode 20 is formed, extends into the DA, so that the scattered-reflection control part 50 may be formed. Thus, the scattered-reflection control part 50 may include the same material as that of the electrode substrate 51. That is, the scattered-reflection control part 50 may include one of PET (polyethyleneterephthalate), PC (polycarbonate), PES (polyether sulfone), PI (polyimide) and PMMA (PolyMethly MethaAcrylate).

However, the embodiment is not limited the above, and as shown in (b) of FIG. 6, the scattered-reflection control part 50 may be spaced apart from the electrode substrate 51 such that the scattered-reflection control part 50 may be independently formed between the cover window 10 and the sensor part 60. The scattered-reflection control part 50 may include the same material as that of the electrode substrate 51, or a material different from that of the electrode substrate 51. That is, the scattered-reflection control part 50 may include a material with which a scattered reflection is easily performed.

Further, as shown in (c) of FIG. 6, the scattered-reflection control part 50 may be formed only at rims of the light receiving part 60a and the light emitting part 60b so that the scattered-reflection control part 50 may cover the parts of the light receiving part 60a and the light emitting part 60b.

Figure 7:
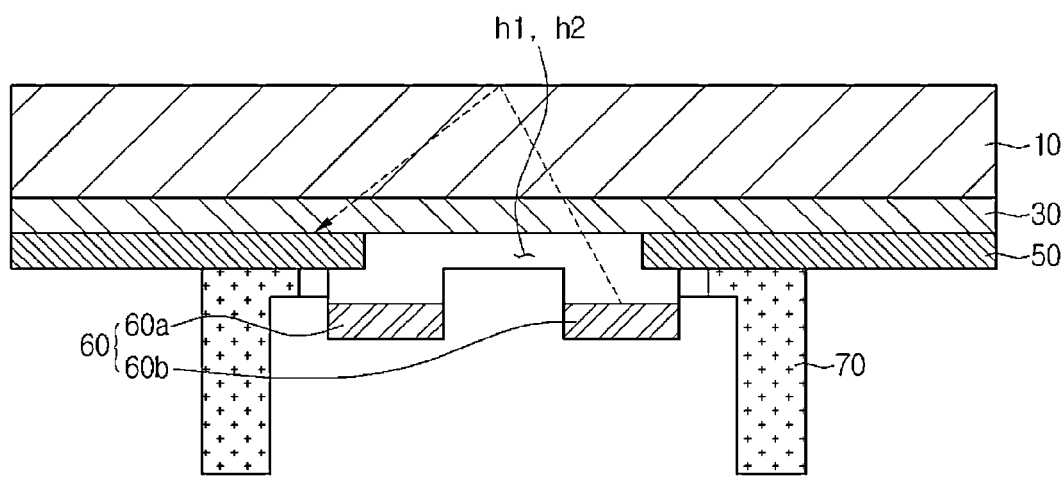
FIGS. 7 to 11 are sectional views showing a touch window according to another embodiment.

Meanwhile, referring to FIG. 7, the first and second through holes h1 and h2 may be integrally formed. The first and second through holes h1 and h2 may not be formed at regions corresponding to each of the light receiving part 60a and the light emitting part 60b, and may be formed together.

Figure 8:
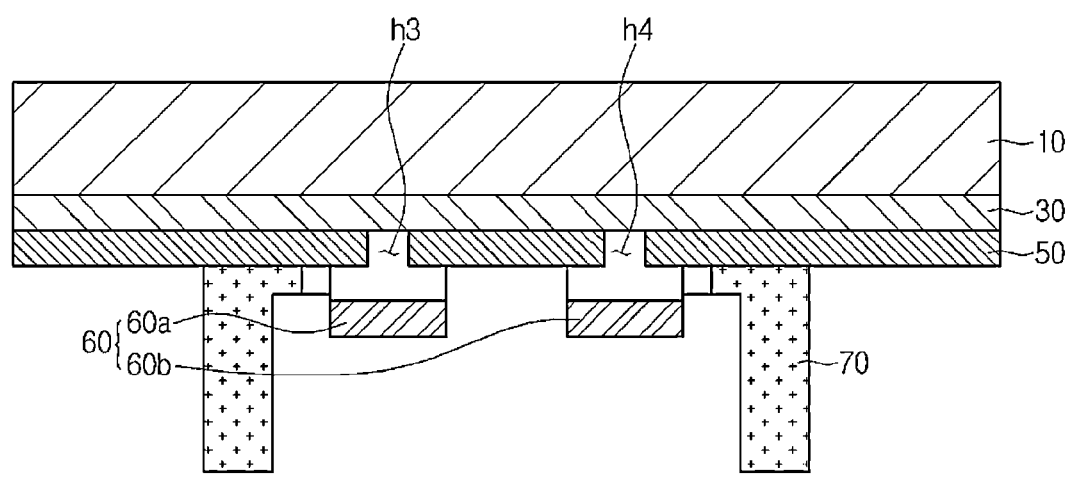

Meanwhile, referring to FIG. 8, the adhesive layer 30, which is placed in the DA, may include the third and fourth through holes h3 and h4. In detail, the third through hole h3 is disposed at the position corresponding to the light receiving part 60a. The fourth through hole h4 is disposed at the position corresponding to the light emitting part 60b.

Hereinafter, a touch window according to another embodiment will be described with reference to FIGS. 9 and 10.

Figure 9:
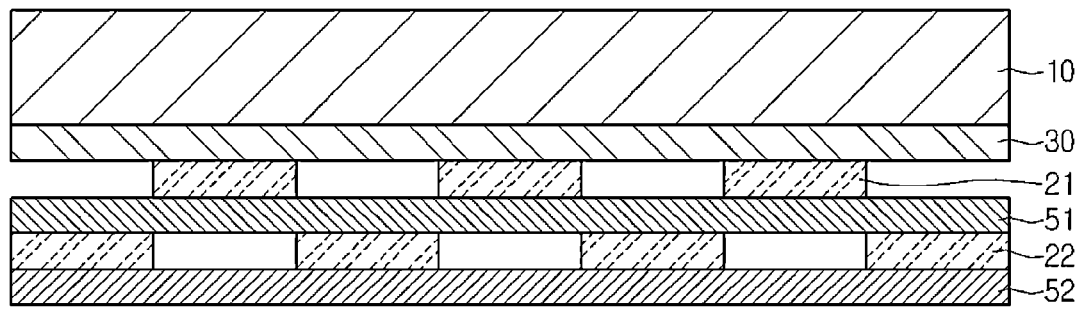

Referring to FIG. 9, a cover window 10, a first electrode 21, a first electrode substrate 51, a second electrode 22, a second electrode substrate 52 and an adhesive layer 30 are formed in the VA.

The first electrode 21 is formed on the first electrode substrate 51. The second electrode 22 is formed on the second electrode substrate 52. The touch window according to the embodiment has a structure in which the first and second electrodes 21 and 22 are disposed at mutually different layers.

Figure 10:
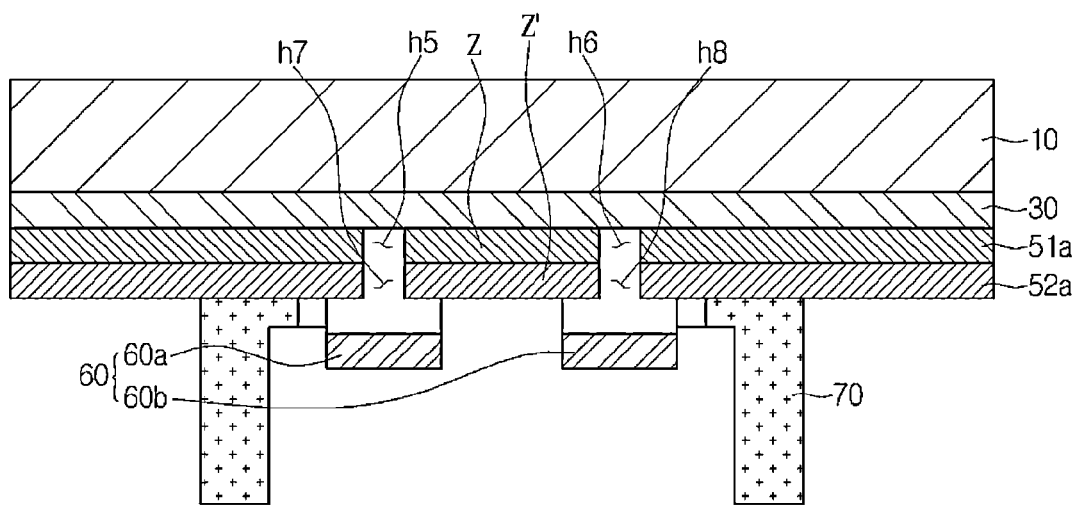

Referring to FIG. 10, the sensor part 60 is disposed in the DA. A first scattered reflection control part 51a extending from the first electrode substrate 51 and the second scattered reflection control part 52a extending from the second electrode substrate 52 are formed between the cover window 10 and the sensor part 60.

The first and second electrode substrates 51 and 52, which are formed in the VA, extend into the DA, such that the first and second scattered reflection control parts 51a and 52a may be formed.

The first scattered reflection control parts 51a includes the fifth and sixth through holes h5 and h6. In detail, the fifth through hole h5 is disposed at the position corresponding to the light receiving part 60a. The sixth through hole h6 is disposed at the position corresponding to the light emitting part 60b.

The second scattered reflection control part 52a includes the seventh and eighth through holes h7 and h8. In detail, the seventh through hole h7 is disposed at the position corresponding to the light receiving part 60a. The eighth through hole h8 is disposed at the position corresponding to the light emitting part 60b.

A region Z formed between the fifth and sixth through holes h5 and h6 and a region Z' between the seventh and eighth through holes may be the same as or different from each other. The regions Z and Z' may be formed to be the same as or different from each other by taking into consideration a signal scattered-reflection rate of the sensor part 60.

Figure 11:
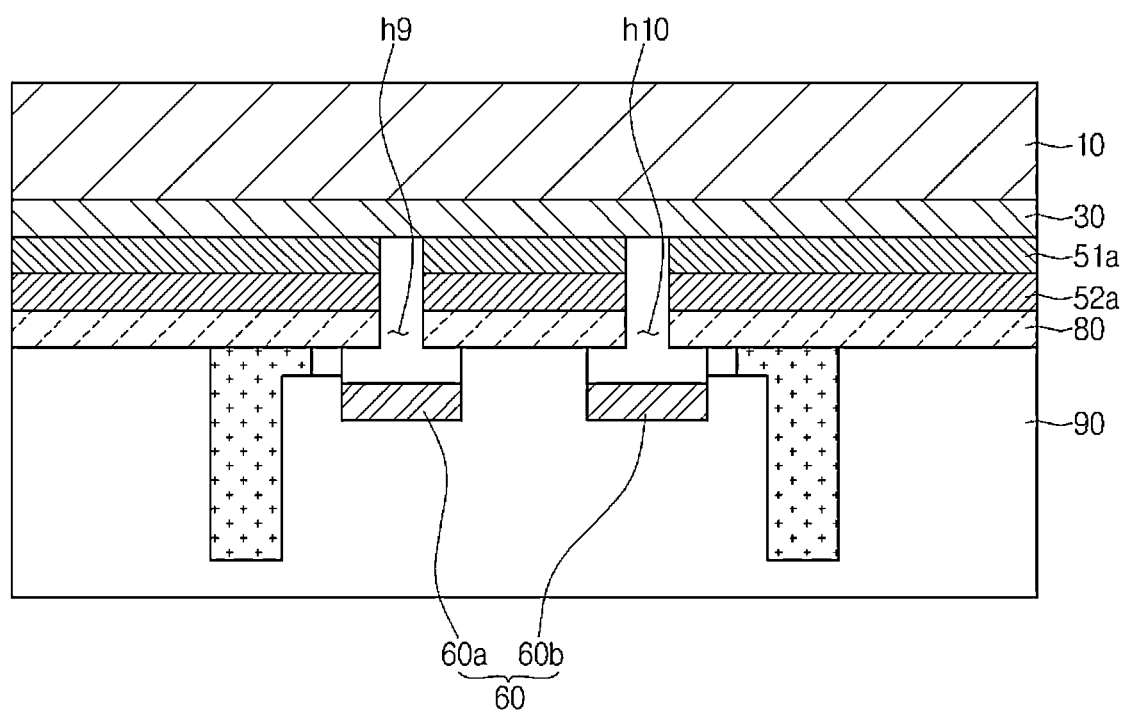

Referring to FIG. 11, the touch window according to the embodiment may be installed in various display devices 90. Such a display device 90 includes a liquid crystal display device, an organic light emitting device, and a plasma display panel. A shield layer 80 may be selectively disposed between the touch window and the display device 90 in order to prevent a malfunction of a touch sensing panel from occurring due to the reason that a noise component generated by driving the display device is transferred to a touch sensor module, that is, the touch window. The shield layer 80 may be formed of one of a hard coating film, an anti-glare film, an anti-reflective film and a low-reflective film.

A third scattered-reflection control part extending the shield layer 80 may be further included in the DA in which the sensor part 60 is disposed. The third scattered-reflection control part includes the ninth and tenth through holes h9 and h10. In detail, the ninth through hole h9 is disposed at the position corresponding to the light receiving part 60a. The tenth through hole h10 is disposed at the position corresponding to the light emitting part 60b.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch window comprising:
   a cover window where a view area and a dead area surrounding the view area are defined;
   an electrode in the view area, the electrode sensing a touch position;
   an electrode substrate on which the electrode is formed;
   a sensor part in the dead area, the sensor part including a light receiving part and a light emitting part; and a scattered-reflection control part between the cover window and the sensor part.

2. The touch window of claim 1, wherein the scattered-reflection control part extends from the electrode substrate.

3. The touch window of claim 1, wherein the scattered-reflection control part is spaced apart from the electrode substrate and is disposed in the dead area.

4. The touch window of claim 1, wherein the scattered-reflection control part includes a first through hole corresponding to the light receiving part and a second through hole corresponding to the light emitting part.

5. The touch window of claim 4, wherein diameters of the first and second through holes are less than lengths of sections of the light receiving part and the light emitting part.

6. The touch window of claim 4, wherein the first and second through holes are integrally formed.

7. The touch window of claim 4, further comprising:
an adhesive layer between the cover window and the electrode substrate.

8. The touch window of claim 7, wherein the adhesive layer includes a third through hole corresponding to the light receiving part and a fourth through hole corresponding to the light emitting part.

9. The touch window of claim 8, wherein the electrode includes a first electrode on a first electrode substrate and a second electrode on a second electrode substrate, and the scattered-reflection control part includes a first scattered-reflection control part extending from the first electrode substrate and a second scattered-reflection control part extending from the second substrate.

10. The touch window of claim 9, wherein the first scattered-reflection control part includes a fifth through hole corresponding to the light receiving part and a sixth through hole corresponding to the light emitting part, and the second scattered-reflection control part includes a seventh through hole corresponding to the light receiving part and an eighth through hole corresponding to the light emitting part.

11. The touch window of claim 10, further comprising:
a display device disposed at a lower portion of the over window; and
a shield layer disposed between the cover window and the display device, wherein the scattered-reflection control part includes a third scattered reflection control part extending from the shield layer.

12. The touch window of claim 11, wherein the third scattered-reflection control part includes a ninth through hole corresponding to the light receiving part and a tenth through hole corresponding to the light emitting part.

* * * * *